(12) United States Patent
Blagodurov et al.

(10) Patent No.: US 10,318,340 B2
(45) Date of Patent: Jun. 11, 2019

(54) NVRAM-AWARE DATA PROCESSING SYSTEM

(71) Applicants: ATI Technologies ULC, Markham (CA); Advanced Micro Devices, Inc., Sunnyvale, CA (US)

(72) Inventors: Sergey Blagodurov, Markham (CA); Gabriel H. Loh, Bellevue, WA (US); Mauricio Breternitz, Austin, TX (US)

(73) Assignees: ATI Technologies ULC, Markham (CA); Advanced Micro Devices, Inc., Santa Clara, CA (US)

( * ) Notice: Subject to any disclaimer, the term of this patent is extended or adjusted under 35 U.S.C. 154(b) by 448 days.

(21) Appl. No.: 14/587,325

(22) Filed: Dec. 31, 2014

(65) Prior Publication Data

US 2016/0188456 A1 Jun. 30, 2016

(51) Int. Cl.
```
G06F 12/02      (2006.01)
G06F 9/48       (2006.01)
G11C 11/00      (2006.01)
G06F 12/0811    (2016.01)
```

(52) U.S. Cl.
CPC .............. *G06F 9/48* (2013.01); *G11C 11/005* (2013.01); *G06F 12/0238* (2013.01); *G06F 12/0811* (2013.01); *G06F 2212/205* (2013.01); *G06F 2212/2228* (2013.01)

(58) Field of Classification Search
CPC ............ G06F 12/0246; G06F 12/0638; G06F 12/0833; G06F 12/128; G06F 2212/205; G06F 2212/228; G06F 2212/62; G06F 2212/7201; G11C 11/005
See application file for complete search history.

(56) References Cited

U.S. PATENT DOCUMENTS

| | | | | |
|---|---|---|---|---|
| 5,752,031 A | * | 5/1998 | Cutler | G06F 9/52 718/103 |
| 6,938,184 B2 | * | 8/2005 | Totolos, Jr. | G06F 11/2015 709/238 |
| 7,493,424 B1 | * | 2/2009 | Bali | G06F 13/28 709/212 |

(Continued)

OTHER PUBLICATIONS

Jeffrey C. Mogul, Eduardo Argollo, Mehul Shah, and Paolo Faraboschi. 2009. Operating system support for NVM+DRAM hybrid main memory. In Proceedings of the 12th conference on Hot topics in operating systems (HotOS'09). USENIX Association, Berkeley, CA, USA, 14-14.*

(Continued)

*Primary Examiner* — Ramon A. Mercado
(74) *Attorney, Agent, or Firm* — Polansky & Associates, P.L.L.C.; Paul J. Polansky

(57) ABSTRACT

In one form, a computer system includes a central processing unit, a memory controller coupled to the central processing unit and capable of accessing non-volatile random access memory (NVRAM), and an NVRAM-aware operating system. The NVRAM-aware operating system causes the central processing unit to selectively execute selected ones of a plurality of application programs, and is responsive to a predetermined operation to cause the central processing unit to execute a memory persistence procedure using the memory controller to access the NVRAM.

20 Claims, 4 Drawing Sheets

(56) References Cited

U.S. PATENT DOCUMENTS

| | | | | |
|---|---|---|---|---|
| 7,613,880 | B2* | 11/2009 | Miura | G11C 7/20 |
| | | | | 711/103 |
| 7,962,686 | B1* | 6/2011 | Tracht | G06F 13/28 |
| | | | | 710/260 |
| 2005/0099427 | A1* | 5/2005 | Stokes | G09G 5/02 |
| | | | | 345/589 |
| 2005/0251617 | A1* | 11/2005 | Sinclair | G06F 3/061 |
| | | | | 711/103 |
| 2007/0101077 | A1* | 5/2007 | Evanchik | G06F 9/4418 |
| | | | | 711/162 |
| 2007/0288683 | A1* | 12/2007 | Panabaker | G06F 12/06 |
| | | | | 711/101 |
| 2007/0294693 | A1* | 12/2007 | Barham | G06F 9/4881 |
| | | | | 718/102 |
| 2012/0254541 | A1* | 10/2012 | Beckmann | G06F 12/0806 |
| | | | | 711/122 |
| 2013/0061237 | A1* | 3/2013 | Zaarur | G06F 9/4856 |
| | | | | 718/105 |
| 2013/0091331 | A1* | 4/2013 | Moraru | G06F 12/126 |
| | | | | 711/143 |
| 2013/0346718 | A1* | 12/2013 | Meshchaninov | G06F 12/0623 |
| | | | | 711/164 |
| 2015/0012690 | A1* | 1/2015 | Bruce | G06F 12/0811 |
| | | | | 711/103 |
| 2015/0095605 | A1* | 4/2015 | Roberts | G06F 3/0659 |
| | | | | 711/167 |
| 2015/0378841 | A1* | 12/2015 | Jayakumar | G06F 9/4401 |
| | | | | 714/6.12 |
| 2016/0118121 | A1* | 4/2016 | Kelly | G06F 13/4068 |
| | | | | 710/301 |
| 2016/0188456 | A1* | 6/2016 | Blagodurov | G06F 12/0246 |
| | | | | 711/103 |

OTHER PUBLICATIONS

Sina, NVDIMM Messaging and FAQ, Jan. 2014. (Year: 2014).*

Donald E. Porter, Owen S. Hofmann, Christopher J. Rossbach, Alexander Benn, and Emmett Witchel. 2009. Operating System Transactions. In Proceedings of the ACM SIGOPS 22nd symposium on Operating systems principles (SOSP '09). ACM, New York, NY, USA, 161-176. (Year: 2009).*

Katelin A. Bailey, Peter Hornyack, Luis Ceze, Steven D. Gribble, and Henry M. Levy. 2013. Exploring storage class memory with key value stores. In Proceedings of the 1st Workshop on Interactions of NVM/FLASH with Operating Systems and Workloads (INFLOW '13). (Year: 2013).*

Staimer, NVDIMM vs. memory cahnnel flash storage, Jul. 2014. (Year: 2014).*

"How does the OS detect hardware?"; Sep. 17, 2013. (Year: 2013).*

* cited by examiner

NVRAM-AWARE DATA PROCESSING SYSTEM

FIELD

This disclosure relates generally to data processing systems, and more specifically to data processing systems having non-volatile random access memory (NVRAM).

BACKGROUND

For many years, computer main memory has been dominated by dynamic random access memory (DRAM) because of its high density, fast access time, and low cost. However DRAM is volatile and loses its contents when power is removed. DRAM's volatility has required computer users to wait for several minutes every time the computer starts up while the basic input-output system (BIOS) and operating system load information from a slower computer disk and set up the DRAM memory for normal program execution.

Floating-gate non-volatile memory is another memory technology that has low cost and high density. Some computers today use solid-state drives based on floating-gate non-volatile memory in place of disk drives to store the operating system and application programs. However floating-gate non-volatile memory does not support random access because it suffers from long write times and therefore it cannot replace DRAM in the system.

In recent years new types of non-volatile memory with random access capability, referred to as NVRAM, have been emerging. These new NVRAM types include phase change memory (PCM), spin-torque transfer (STT) memory, memristor, magneto-resistive random access memory (MRAM), ferro-electric random access memory (FeRAM), and resistive random access memory (RRAM). Once NVRAM becomes commercially available, it will be a more suitable replacement for DRAM as main computer memory than traditional floating-gate memory because of its fast, random access times.

However, existing computer software is not adapted to take advantage of these new types of NVRAM to provide a better user experience. In addition while computer operating systems can be modified to add new application programming interfaces (APIs) to allow application software to use the persistence of the NVRAM, it would be prohibitively costly to rewrite the very large base of application software to take advantage of these new APIs.

Figure 1:
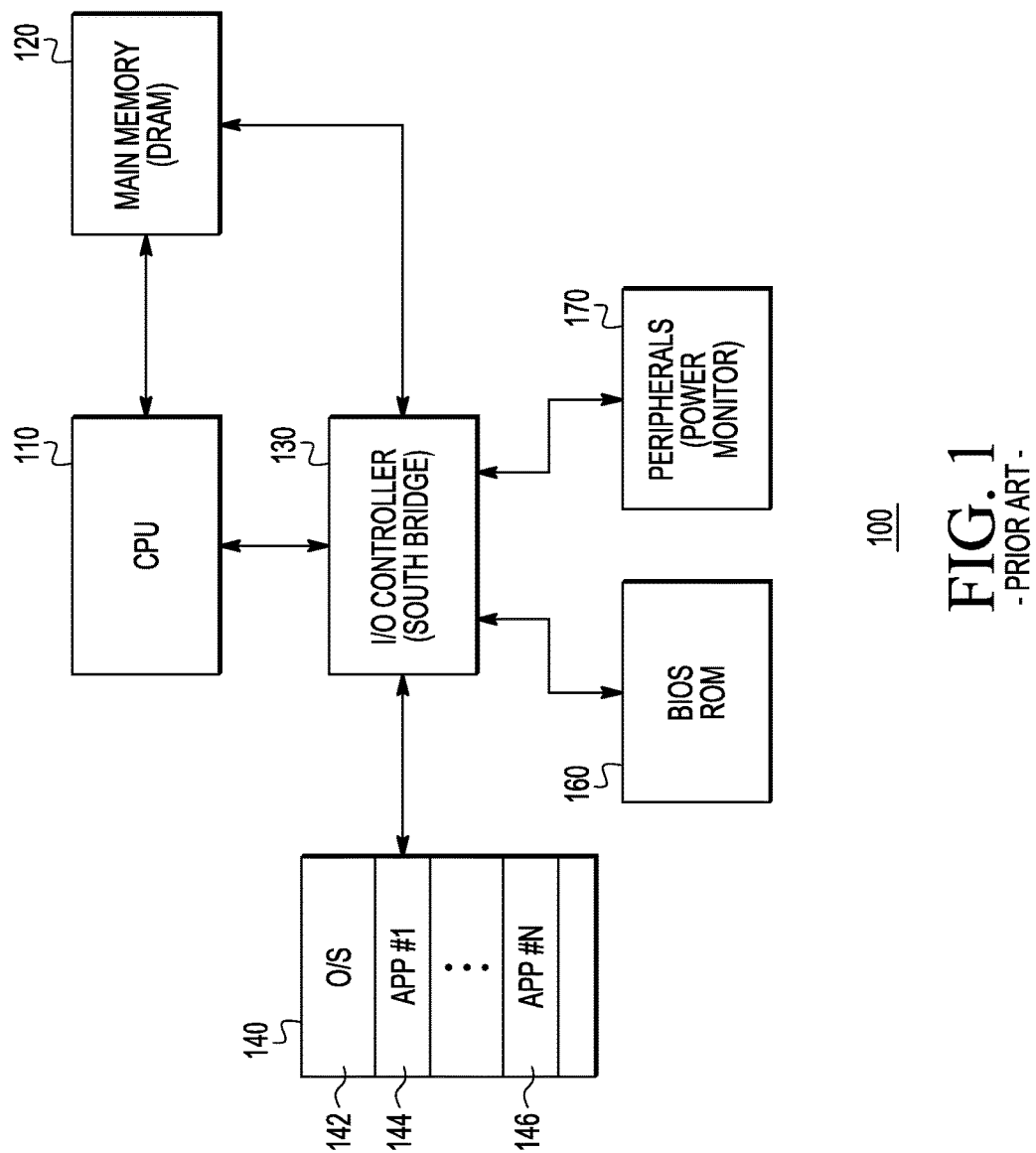
FIG. 1 illustrates in block diagram form a computer system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A computer system as disclosed below includes a central processing unit, a memory controller coupled to the central processing unit and capable of accessing non-volatile random access memory (NVRAM), and an NVRAM-aware operating system. The NVRAM-aware operating system causes the central processing unit to selectively execute selected ones of a plurality of application programs, and is responsive to a predetermined operation to cause the central processing unit to execute a memory persistence procedure using the memory controller to access the NVRAM. Examples of the predetermined operation include detection of a state synchronizing operation, a predetermined method call, and a resource pattern match. Examples of the memory persistence procedure include flushing at least one cache to the NVRAM, and serializing store operations.

In some embodiments, a computer system includes a plurality of application programs and a non-volatile random access memory (NVRAM)-aware operating system. The NVRAM-aware operating system has at least one application programming interface (API) to the plurality of application programs, and an interface to a plurality of hardware resources including a central processing unit having an NVRAM controller. The NVRAM-aware operating system causes the plurality of hardware resources to execute selected ones of the plurality of application programs, and is further responsive to a predetermined operation to cause the plurality of hardware resources to execute a memory persistence procedure using the memory controller to access the NVRAM.

In some embodiments, a method for use in a computer system having a non-volatile random access memory (NVRAM) includes selectively executing a plurality of application programs, detecting a predetermined operation during said selectively executing, and executing a memory persistence procedure using the NVRAM in response to the detecting.

Such a computer system and method modifies an existing operating system to make it NVRAM-aware. Instead of requiring the operating system to be rewritten to take advantage of the existence of NVRAM in the system through new APIs, and the application programs to be rewritten to call the APIs during program execution, the NVRAM-aware operating system proactively detects and takes advantage of opportunities to use the NVRAM to store data persistently that may have otherwise been lost from volatile memory as a result of an unexpected power outage. After system restart, application program execution can resume from the point at which the power outage occurred without having to fetch a large number of memory pages from a disk drive and store them again into main memory.

FIG. 1 illustrates in block diagram form a computer system 100 known in the prior art. Computer system 100 includes a central processing unit 110, a main memory 120, an input/output controller, also known as a "Southbridge" 130, a mass storage system 140, a basic input/output system (BIOS) read-only memory (ROM) 160, and a plurality of system peripherals 170.

CPU 110 is frequently implemented as a multi-core, single-chip processor which has an integrated graphics processing unit (GPU) and an integrated systems memory controller known as a "Northbridge". This configuration is known as an accelerated processing unit (APU).

Main memory 120 is implemented as low-cost, dynamic random access memory (DRAM), such as DRAM conforming to the double-data rate (DDR) standard specified by the Joint Electron Devices Engineering Council (JEDEC).

Southbridge 130 includes an interface to a mass storage system 140. Mass storage system 140 includes an operating system 142, and a set of N application programs including a first application program 144 labeled "APP #1" and an $N^{th}$ application program labeled "APP #N". FIG. 1 illustrates these as adjacent in mass storage system 140 for simplicity, but they are typically located in various parts of the memory space and will oftentimes be stored in physically remote and non-contiguous areas. In some systems, mass storage system 140 is a hard disk drive. In other systems, mass storage system 140 is a conventional, floating-gate non-volatile memory.

Southbridge 130 further includes an interface to BIOS ROM 160. BIOS ROM 160 stores the BIOS for computer system 100 that allows operating system 142 to interface with the hardware. One main function of the BIOS is to detect the presence of devices in the system and determine the configuration of main memory 120, such as how many dual-inline memory modules (DIMMs) are present in the system, what their capabilities are, etc., and it has a serial connection to main memory 120 for that purpose.

Southbridge 130 also includes an interface to a variety of input/output peripherals 170 such as a keyboard, a mouse, a camera, universal serial bus (USB) ports, and the like. Peripherals 170 include a system power monitor that can detect and report various power outage conditions, such as turning off of power via an on/off switch, and detection of a low-battery condition.

As noted above after power outage, DRAM loses its state. Thus upon restart of the computer and re-launch of an application program, the operating system will have to move large memory pages from mass storage system 140 back to main memory 120, a process that takes a significant amount of time and can be annoying to a user.

Figure 2:
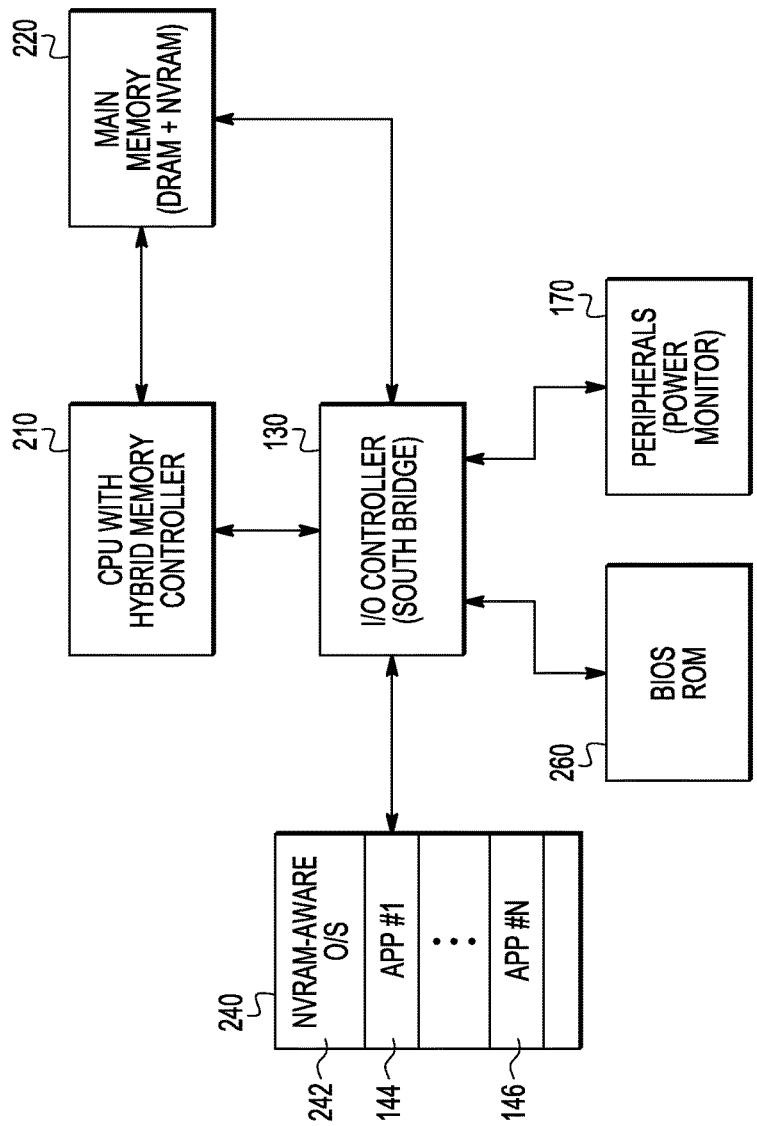
FIG. 2 illustrates in block diagram a computer system with an NVRAM-aware operating system according to some embodiments.

FIG. 2 illustrates in block diagram a computer system 200 with an NVRAM-aware operating system according to some embodiments. Computer system 200 is similar to computer system 100 of FIG. 1, and like elements have the same reference numbers. However computer system 200 includes a main memory 220 having both DRAM and non-volatile random access memory (NVRAM), and a CPU 210 having a hybrid memory controller capable of accessing both DRAM and NVRAM. In addition, a mass storage system 240 includes an NVRAM-aware operating system 242 as well as the same set of N application programs of which representative application programs 144 and 146 are shown in FIG. 2, and a BIOS ROM 260 with an updated BIOS.

Main memory 220 includes both standard DRAM and NVRAM, in which the NVRAM retains its state upon removal of power. There are several types of NVRAM known or currently in development that can be used as the NVRAM in main memory 220. These types include phase change memory (PCM), spin-torque transfer (STT) memory, memristor, magneto-resistive random access memory (MRAM), ferro-electric random access memory (FeRAM), and resistive random access memory (RRAM), but NVRAM 220 can be implemented with other types of NVRAM yet to be developed.

CPU 210 is different from CPU 110 of FIG. 1 in that it includes a hybrid memory controller capable of performing read and write accesses to NVRAM as well as to standard DRAM. In various embodiments, the hybrid memory controller can be implemented with either a single memory controller capable of accessing both NVRAM and DRAM, or separate NVRAM and DRAM controllers and corresponding physical interfaces.

NVRAM-aware operating system 240 is different from operating system 140 of FIG. 1 because it includes the capability to detect certain operations occurring in computer system 200, and to perform a memory persistence procedure in response to the detected operation. The BIOS in BIOS ROM 260 is also different from the BIOS in BIOS ROM 160 by including the capability of detecting that main memory 220 includes NVRAM and reporting that condition to operating system 240.

Figure 3:
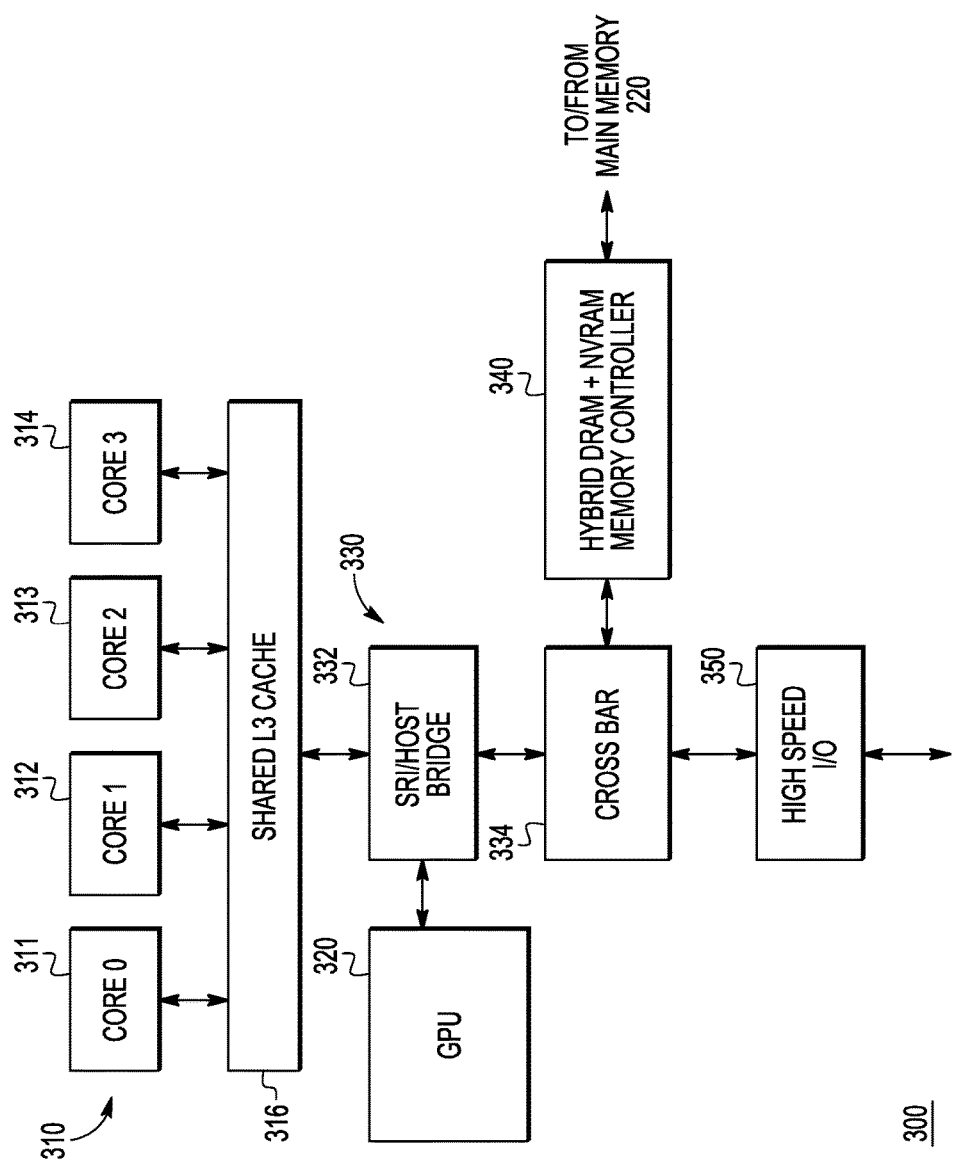
FIG. 3 illustrates in block diagram form a central processing unit (CPU) chip that may be used in the computer system of FIG. 2.

FIG. 3 illustrates in block diagram form a central processing unit (CPU) chip 300 that may be used in computer system 200 of FIG. 2. Central processing unit chip 300 generally includes a CPU portion 310, a GPU core 320, an interconnection circuit 330, a hybrid DRAM+NVRAM memory controller 340, and a high-speed input/output controller 350. CPU chip 300 includes both CPU portion 310 and GPU core 320 on the same chip, and it is considered to be an "accelerated processing unit" (APU).

CPU portion 310 includes CPU cores 311-314 labeled "CORE0", "CORE1", "CORE2", and "CORE3", respectively, and a shared level three (L3) cache 316. Each CPU core is capable of executing instructions from an instruction set under the control of an operating system, and each core may execute a unique program thread. Each CPU core includes its own level one (L1) and level two (L2) caches, but shared L3 cache 316 is common to and shared by all CPU cores. Shared L3 cache 316 operates as a memory accessing agent to provide memory access requests including memory read bursts for cache line fills and memory write bursts for cache line writebacks.

GPU core 320 is an on-chip graphics processor and also operates as a memory accessing agent.

Interconnection circuit 330, also known as the Northbridge, generally includes a system request interface (SRI)/host bridge 332 and a crossbar 334. SRI/host bridge 332 queues access requests from shared L3 cache 316 and GPU core 320 and manages outstanding transactions and completions of those transactions. Crossbar 334 is a crosspoint switch between three bidirectional ports, one of which is connected to SRI/host bridge 332.

Memory controller 340 has a first bidirectional port connected to crossbar 334 and a second bidirectional port for connection to main memory 220. Memory controller 340 generates specific read and write transactions to main memory 220 for requests from CPU cores 311-314 and GPU core 320 based on the memory type. Memory controller 340 also manages the overhead of the hybrid DRAM+NVRAM interface such as by grouping transactions for efficient use of the memory bus and the like. It also provides an interface to main memory 220 by managing the physical signaling based on the memory type.

High-speed input/output controller 350 includes one or more high-speed interface controllers. For example, input/output controller 350 may contain three interface controllers that comply with the HyperTransport link protocol.

It should be apparent that CPU chip 300 is just one example of a CPU that can be used as CPU 210 of FIG. 1. In other embodiments, a CPU with components interconnected over a bus rather than through crossbar switch 332 may also be used. Moreover the number of CPU cores and the number and configuration of the caches, I/O ports, and GPU cores will vary between different embodiments.

Figure 4:
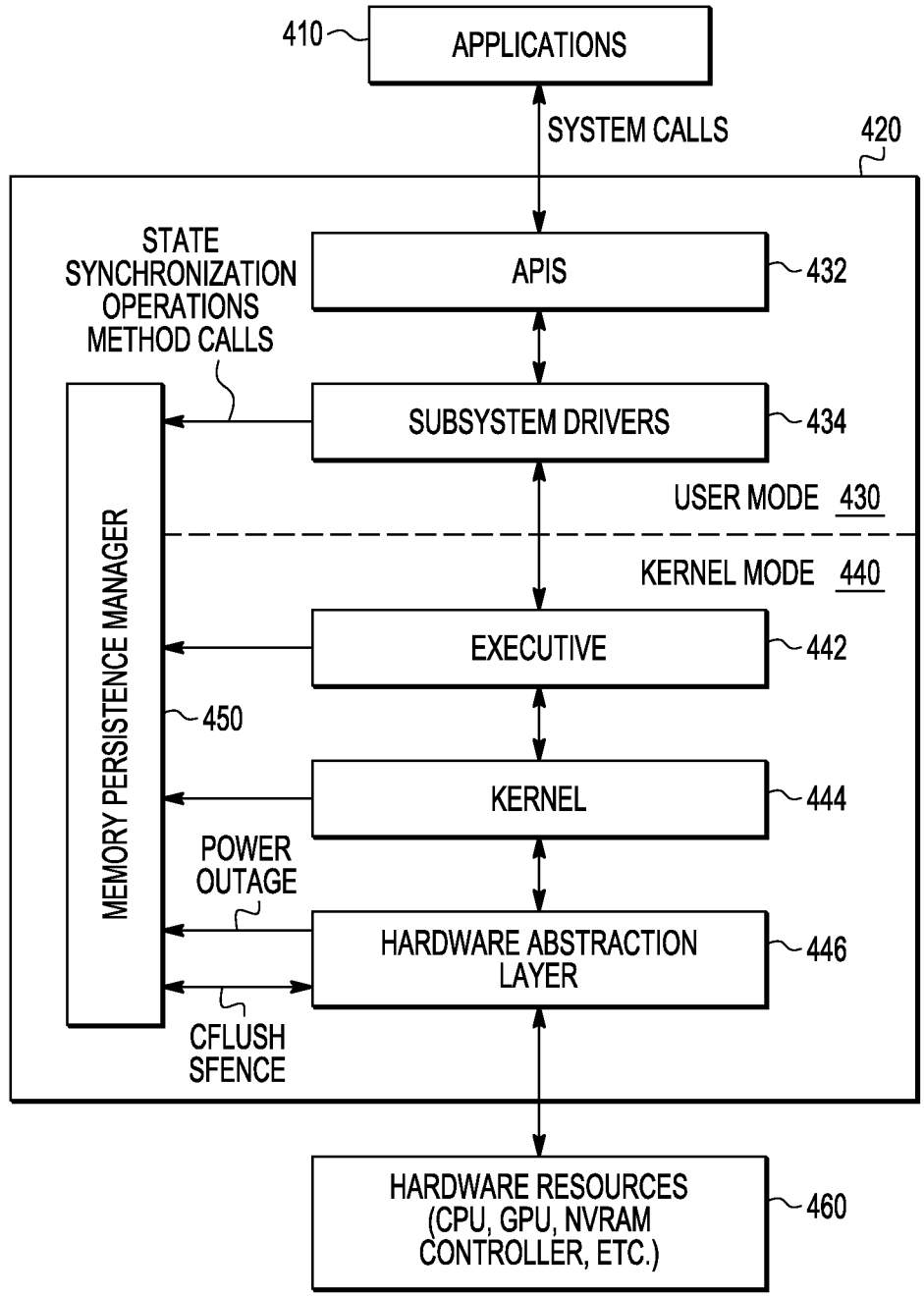
FIG. 4 illustrates a block diagram of a software system including an NVRAM-aware operating system that can be used as the operating system of FIG. 2 according to some embodiments.

FIG. 4 illustrates a block diagram of a software system 400 including an NVRAM-aware operating system 420 that can be used as operating system 242 of FIG. 2 according to some embodiments. Software system 400 also includes application program layer 410 labeled "APPLICATIONS" and a hardware resource layer 460.

Application program layer 410 represents all the applications that are running in the computer system at a particular point in time, and will generally include some but not all of the N application programs shown in FIG. 2.

NVRAM-aware operating system 420 uses an architecture similar to the architecture of the operating system known as Windows 7 available from the Microsoft Corporation of Redmond, Wash. NVRAM-aware operating system 420 itself includes two hierarchical portions including a user mode 430 and a kernel mode 440. User mode 430 includes an application programming interface layer 432 that includes a set of application programming interfaces (APIs) that allow both current and legacy application programs to interact with the operating system 420. The application programs interact with application programming interface layer 432 using a set of system calls that are different for each application programming environment. For example, the APIs can support programs written for MS-DOS, 16-bit Windows, and 32-bit Windows environments. API layer 432 translates these system calls into a standard set of commands provided to a driver 434, labeled "SUBSYSTEM DRIVERS".

Kernel mode 440 generally includes an executive layer 442, a kernel layer 444, and a hardware abstraction layer 446. Executive layer 442 provides a set of common services that the user can use. Components of executive layer 442 include an object manager, a power manager, a process manager, an I/O manager, a virtual memory manager, a local procedure call facility, and a cache manager, a security reference monitor, a plug and play monitor, and a device driver manager. Among other tasks, kernel layer 444 manages input/output requests from software, and using hardware abstraction layer 446, translates them into instructions executable by the central processing unit. Hardware abstraction layer 446 contains individual device drivers, and includes a registry of devices and capabilities of the system. The registry is a hierarchical database that stores configuration settings and options. It contains settings for low-level operating system components but also for application programs running on the platform that have opted to use the registry. For example on power-up, the BIOS adds the size and type of memory to the registry.

In addition to these conventional components, operating system 420 includes a memory persistence manager 450. Memory persistence manager 450 has the responsibility of detecting an operation that can take advantage of the presence of NVRAM without an explicit system call but rather based on operations that are observable by operating system 420. Thus operating system 420 exploits the presence of NVRAM without modification of existing application programs.

Memory persistence manager 450 is connected to several layers of the operating system hierarchy in both the user mode 430 and kernel mode 440. For example, memory persistence manager 450 may be connected (as shown in FIG. 4) to driver 434 in user mode 430 to receive indications of state synchronization operations and method calls, both of which are suitable for the usage of memory persistence procedures. Memory persistence manager 450 is also connected to executive layer 442, kernel layer 444, and hardware abstraction layer 446 in kernel mode 440 to detect other operations that are suitable for performing memory persistence procedures.

Memory persistence manager 450 may perform a variety of memory persistence procedures in response to detecting an eligible operation. For example, the first memory persistence procedure involves flushing the parts of the memory system that remain volatile, such as the caches and write buffers, into NVRAM 320. Popular microprocessor instruction sets include explicit commands for flushing the caches and write buffers. For example these include the cache flush ("CFLUSH") instruction in the x86 architecture, and a move to control register ("MCR") instruction identifying an appropriate control register in the Advanced RISC Machines (ARM) architecture, but similar instructions exist in other microprocessor architectures.

The second memory persistence procedure is serializing store operations to ensure that the data is written to NVRAM in the right order. Known serialization operations include the "SFENCE" instruction in the x86 architecture and the "DMB" instruction in the ARM architecture.

Memory persistence manager 450 interacts with the layers of operating system 420 to detect certain operations that are suitable for the invocation of persistency procedures. One example includes operations that synchronize the state of multi-process applications. These are commonly found in applications written with the Message Passing Interface (MPI) paradigm or similar library or software support. An MPI workload is comprised of many identical processes, known as ranks, executing the same or similar code on a portion of an input data set over and over again. In one embodiment, operating system 420 can distinguish MPI ranks from other processes by looking at the binary name of the process' parent in the process table. For example in the Linux operating system, the process's parent can be read from the pseudo file "/proc/<PPID>/stat", where <PPID> is the process ID of the parent. Processes that are MPI ranks have a parent with the binary name that contains the word "mpirun" (if it runs on the first node of the job) or "orted" (if it runs on a different node of the job).

Once a portion of the input set is processed, a rank may then synchronize its state with other ranks in the job. These scatter/gather operations are often implemented with special routines (e.g., "MPI_Scatter", "MPI_Gather", and "MPI_Allgather"). Operating system 420 detects the instructions corresponding to these routines on-the-fly to mark the beginning or end of a corresponding scatter/gather period. In one embodiment, operating system 420 detects a state synchronization operation by recompiling the source code of the application so that the modified job emits a special signal every time the relevant routine is executed. In another embodiment, operating system 420 causes the procedure to generate a fault when executed, such as by changing the permissions of the page where the code resides, or by dynamically modifying the code. For example, operating system 420 could replace the first instruction of the function with an illegal instruction to generate an illegal instruction fault that operating system 420 will trap on. In another implementation, rather than recompiling the application source code, a modified version of the MPI library (or similar software) is used that includes code to notify operating system 420 upon execution of an API call of interest.

In yet another embodiment, operating system 420 further detects suitable operations in application programs written for a heterogeneous system architecture (HSA) or that otherwise use a relaxed consistency memory model. The relaxed consistency model is the official memory model for the Java, C++11, and OpenCL 2.0 programming languages, and thus these persistency compliant operations are likely to be widely used. The relaxed consistency model assumes that the memory is split into several segments with different visibility and consistency requirements. For example, a global memory segment is visible to all agents (GPUs and CPUs), whereas a group memory segment is visible only to workitems in a workgroup. In order to make the data visible to another workgroup or to make the stores consistent, a program may issue a special SYNC or SFENCE operation that can then be detected to perform additional memory persistence procedures.

The second example includes operations that mark the invocation and termination of particular long-running methods. For many applications, a method call initiates the execution of a long series of operations. For example in a compiler, a call to "parse" may initiate I/O reads, allocate memory, initiate buffer scans, etc. In one embodiment, operating system 420 "marks" certain long-running methods as suitable for a memory persistence procedure. Operating system 420 seamlessly stores the execution results of this method in NVRAM upon the exit from the function call. To justify the overhead of executing the memory persistence procedure, operating system 420 only performs the memory persistence procedures for methods expected to be long-running Operating system 420 can detect suitable methods beforehand by detecting the number of lines of code inside the method, by detecting the number of instructions inside the method during its execution, or by detecting the size of the data structures that are created or accessed within the method.

In one embodiment, program analysis can be performed by a performance analyzer tool known as the "AMD Code-Analyst" tool available from Advanced Micro Devices, Inc. of Sunnyvale, Calif. In another embodiment, operating system 420 can perform real-time analysis using instruction based sampling assistance. For example, operating system 420 can execute an MSRC001_1031 IBS Fetch Linear Address (IC_IBS_LIN_AD) command or a MSRC001_1032 IBS Fetch Physical Address (IC_IBS_PHYS_AD) command and observe their associated counters.

The third example involves the detection of resource access patterns. For example, operating system 420 can profile the resource access patterns of a particular application across multiple dimensions (e.g. memory, chip inter-connect, network, disk I/O). Detection of the resource access pattern takes advantage of the fact that an application program may synchronize its state with other processes in the job every time a recurring period comes to an end, and results in a usage spike of a particular set of resources. Detection of the resource access pattern treats the workload as a "black box" and thus does not require recompilation of the targeted workload or other application-level software changes.

The usage spikes can be detected in different ways, depending on the resources in question. For example, memory usage can be detected by an increase in misses from the CPU cache hierarchy, which is already reflected by performance counters in some microprocessors that may be read through the Model Specific Register space. Also some microprocessor chips provide power management counters for the number of L1 data cache misses, the number of combined instruction/data L2 cache misses, and the number of instructions cache misses, all of which can be monitored to detect usage spikes. Additional performance counters related to I/O accesses such as the number of CPU requests to certain processor nodes and the number of particular events taking place in the Northbridge can also be used. Network traffic can be detected by standard tools like "iptables" and "netstat" that can provide the information on the amount of traffic exchanged by every process with each node in a cluster. I/O accesses to the disk can be detected via a counter that counts requests to a target node. Operating system 420 can also detect a spike in I/O events using the "iostat" command.

In one example, memory persistence manager 450 receives an indication of a power outage from hardware abstraction layer 446, and in one particular example takes the form of an indication from a peripheral in peripherals 150. In response, memory persistence manager 450 flushes the contents of all caches to NVRAM. In the particular example shown in FIG. 4, memory persistence manager 450 provides (or indirectly causes hardware abstraction layer 446 to provide) an instruction known as the "CFLUSH" instruction to all the CPU cores. CFLUSH is a special purpose instruction that causes a CPU core to flush all of its caches to main memory. Thus the memory pages being used by the application program will already be present in the NVRAM upon a removal of the power outage condition and will not have to be re-fetched from mass storage system 240. The speedup in computer system recovery after the power outage event enhances the user's experience.

In another example shown in FIG. 4, memory persistence manager 450 receives an indication of a state synchronization operation. A state synchronization operation is an operation performed by a program thread in a multi-process environment for inter-process communication. In the well-known message passing interface (MPI) protocol, state synchronization operations include "MPI JUMP", "MPI SCATTER", and "MPI GATHER". Memory persistence manager 450 then is responsive to an indication of a state synchronization operations detected by kernel 444 to flush the caches.

The detection of operations that may benefit from memory persistence procedures and the resources used to execute the memory persistence procedures may be implemented with various combinations of hardware and system software. For example, the central processing unit, North-bridge, and high-speed I/O controller may include certain performance counters that the operating system can monitor to detect long-running methods and or other operations that are useful to invoke memory persistence procedures. Moreover different layers of the operating system may be used to detect the particular operations that make it desirable to invoke memory persistence procedures. The operating system may be governed by instructions that are stored in a non-transitory computer readable storage medium and that are executed by at least one processor. In various embodiments, the non-transitory computer readable storage medium includes a magnetic or optical disk storage device, solid-state storage devices such as Flash memory, or other non-volatile memory device or devices. The computer readable instructions stored in the non-transitory computer readable storage medium may be in source code, assembly language code, object code, or other instruction format that is interpreted and/or executable by one or more processors.

Moreover any of the hardware resources of FIG. 2 or 3 may be described or represented by a computer accessible data structure in the form of a database or other data structure which can be read by a program and used, directly or indirectly, to fabricate integrated circuits with the circuits of FIG. 2 or 3. For example, these circuits may be drawn with a schematic capture tool which will generate a netlist or entered directly as a netlist. The netlist comprises a set of circuit elements which also represent the functionality of the hardware comprising an integrated circuit with the circuits of FIG. 2 or 3. The netlist may then be laid out to produce a data set describing geometric shapes to be applied to masks. The masks may then be used in various semiconductor fabrication steps to produce integrated circuits using the circuits of FIG. 2 or 3. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, while the exemplary NVRAM-aware operating system was based on the Windows operating system, similar modifications to other operating systems such as Linux, MAC OS, UNIX, and the like are also contemplated. In these operating systems, the memory persistence manager would interact with similar but not necessarily identical operating system layers to detect suitable operations and perform memory persistence procedures in response to detecting these operations. The processor can also include either a hybrid memory controller capable of accessing both NVRAM and standard DRAM in the example illustrated above, or a dedicated NVRAM controller in computer systems that implement only NVRAM. Also the operation of an NVRAM-aware computer system was illustrated in the context of a four-core APU, but in other embodiments it could be implemented with other types of CPUs and APUs having various numbers and types of cores.

Accordingly, it is intended by the appended claims to cover all modifications of the disclosed embodiments that fall within the scope of the disclosed embodiments.

What is claimed is:

1. A computer system comprising:
a central processing unit;
a memory controller coupled to said central processing unit and capable of accessing non-volatile random access memory (NVRAM); and
an NVRAM-aware operating system for causing said central processing unit to selectively execute selected ones of a plurality of application programs, said NVRAM-aware operating system comprising:
an application programming interface responsive to a plurality of system calls, including system calls that do not reference the presence of NVRAM; and
a memory persistence manager responsive to detecting that the computer system includes NVRAM and to detecting a predetermined operation being performed by said NVRAM-aware operating system under control of said selected ones of said plurality of application programs in response to said system calls, to cause said central processing unit to execute a memory persistence procedure using said memory controller to access said NVRAM, said predetermined operation detected in response to a system call that does not reference the presence of NVRAM and other information associated with said system call.

2. The computer system of claim 1, wherein said predetermined operation comprises a state synchronizing operation of a multi-process application.

3. The computer system of claim 2, wherein said state synchronizing operation is associated with an application program written with a message passing interface (MPI) paradigm.

4. The computer system of claim 1, wherein said predetermined operation comprises a predetermined method call having at least a predetermined length.

5. The computer system of claim 1, wherein said predetermined operation comprises a resource access pattern match.

6. The computer system of claim 1, wherein said central processing unit comprises at least one cache and said memory persistence procedure comprises flushing said at least one cache to said NVRAM.

7. The computer system of claim 6, wherein said memory persistence procedure further comprises storing contents of at least one write buffer in said NVRAM.

8. The computer system of claim 1, wherein said memory persistence procedure comprises serializing store operations.

9. The computer system of claim 1, wherein said memory controller is further capable of accessing dynamic random access memory (DRAM).

10. A computer system comprising:
a plurality of application programs; and
a non-volatile random access memory (NVRAM)-aware operating system comprising:
at least one application programming interface (API) to said plurality of application programs responsive to a plurality of system calls, including system calls that do not reference the presence of NVRAM;
an interface to a plurality of hardware resources including a central processing unit having a memory controller capable of accessing NVRAM for causing said plurality of hardware resources to execute selected ones of said plurality of application programs; and
a memory persistence manager responsive to detecting that the computer system includes NVRAM and to detecting a predetermined operation being performed by said NVRAM-aware operating system under control of said selected ones of said plurality of application programs in response to said system calls, to cause said plurality of hardware resources to execute a memory persistence procedure using said memory controller to access said NVRAM, said predetermined operation detected in response to a system call that does not reference the presence of NVRAM and other information associated with said system call.

11. The computer system of claim 10 wherein said NVRAM-aware operating system comprises:
a plurality of user mode components including said at least one application program interface (API);
a plurality of kernel mode components coupled to said plurality of user mode components and to said plurality of hardware resources; and
said memory persistence manager further coupled to said plurality of user mode components and to said plurality of kernel mode components, and responsive to said predetermined operation to cause said plurality of hardware resources to execute said memory persistence procedure.

12. The computer system of claim 11 wherein said plurality of user mode components comprises:
said at least one API; and
a driver coupled to said at least one API.

13. The computer system of claim 11 wherein said plurality of kernel mode components comprises:
an executive layer coupled to said plurality of user mode components;

a kernel coupled to said executive layer; and a hardware abstraction layer coupled to said kernel and adapted to be coupled to said plurality of hardware resources.

14. A method for use in a computer system having a non-volatile random access memory (NVRAM) comprising:

selectively executing a plurality of application programs, said application programs including programs that provide system calls that do not reference the presence of NVRAM;

detecting that the computer system includes NVRAM;

detecting a predetermined operation during said selectively executing in response to said system calls, said predetermined operation detected in response to a system call that does not reference the presence of NVRAM and other information associated with said system call; and executing a memory persistence procedure using the NVRAM in response to said detecting that the computer system includes NVRAM and to said detecting the predetermined operation in response to said system calls.

15. The method of claim 14, wherein said detecting comprises detecting a state synchronizing operation of a multi-process application.

16. The method of claim 14, wherein detecting comprises detecting a predetermined method call having at least a predetermined length.

17. The method of claim 14, wherein said detecting comprises detecting a resource access pattern match.

18. The method of claim 14, wherein said executing said memory persistence procedure comprises flushing said at least one cache to the NVRAM.

19. The method of claim 18, wherein said executing said memory persistence procedure further comprises storing contents of at least one write buffer in the NVRAM.

20. The method of claim 14, wherein said executing comprises serializing store operations.

* * * * *